(12) United States Patent
Phan et al.

(10) Patent No.: US 6,291,135 B1
(45) Date of Patent: Sep. 18, 2001

(54) IONIZATION TECHNIQUE TO REDUCE DEFECTS ON NEXT GENERATION LITHOGRAPHY MASK DURING EXPOSURE

(75) Inventors: Khoi A. Phan, San Jose; Bharath Rangarajan, Santa Clara; Bhanwar Singh, Morgan Hill, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/494,592

(22) Filed: Jan. 31, 2000

(51) Int. Cl.[7] ................................................... G03F 7/38
(52) U.S. Cl. .................... 430/311; 438/717; 438/715; 438/906; 438/949; 438/944
(58) Field of Search .................. 430/311; 438/717, 438/715, 906, 949, 944

(56) References Cited

U.S. PATENT DOCUMENTS

| | | | |
|---|---|---|---|
| 4,849,642 | 7/1989 | Katsumi | 250/492.2 |
| 5,043,299 | * 8/1991 | Chang et al. | 437/192 |
| 5,310,621 | * 5/1994 | Sayka | 430/311 |
| 5,382,484 | 1/1995 | Hosono | 430/5 |
| 5,464,713 | 11/1995 | Yoshioka et al. | 430/5 |
| 5,472,825 | * 12/1995 | Sayka | 430/311 |
| 5,795,685 | 8/1998 | Liebmann et al. | 430/5 |
| 5,858,879 | * 1/1999 | Chao et al. | 438/725 |
| 5,965,306 | 10/1999 | Mansfield et al. | 430/22 |
| 5,978,501 | 11/1999 | Badger et al. | 382/144 |
| 6,242,361 | * 6/2001 | Lee et al. | 438/710 |

FOREIGN PATENT DOCUMENTS 41 32 561-A1 * 4/1993 (DE).
02-183531-a * 7/1990 (JP).

* cited by examiner

*Primary Examiner*—Cynthia Hamilton
(74) *Attorney, Agent, or Firm*—Amin & Turocy, LLP

(57) ABSTRACT

In one embodiment, the present invention relates to a method of processing a semiconductor structure including a resist thereon, involving contacting the semiconductor structure including the resist with a plasma comprising at least one inert gas selected from the group consisting of nitrogen, helium, neon, argon, krypton and xenon; exposing the semiconductor structure including the resist to actinic radiation having a wavelength of about 160 nm or less through a lithography mask; and developing the resist with a developer.

20 Claims, 3 Drawing Sheets

IONIZATION TECHNIQUE TO REDUCE DEFECTS ON NEXT GENERATION LITHOGRAPHY MASK DURING EXPOSURE

TECHNICAL FIELD

The present invention generally relates to improving lithography by reducing defects on a mask. In particular, the present invention relates to reducing defects on a next generation lithography mask using ionization.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller feature sizes are required. Since numerous conductive features are typically present on a semiconductor wafer, the trend toward higher device densities is a notable concern.

The requirement of small features (and close spacing between adjacent features) requires high resolution lithographic processes. In general, lithography refers to processes for pattern transfer between various media. It is a technique used for integrated circuit fabrication in which a silicon slice, the wafer, is coated uniformly with a radiation-sensitive film, the photoresist. The photoresist coated substrate is baked to evaporate any solvent in the photoresist composition and to fix the photoresist coating onto the substrate. The baked coated surface of the substrate is next subjected to selective radiation using a mask; that is, a mask is employed to effect an image-wise exposure to radiation. The mask permits radiation to contact certain areas of the photoresist and prevents radiation from contacting other areas of the photoresist. This selective radiation exposure causes a chemical transformation in the exposed areas of the photoresist coated surface. Types of radiation commonly used in microlithographic processes include visible light, ultraviolet (UV) light and electron beam radiant energy. After selective exposure, the photoresist coated substrate is treated with a developer solution to dissolve and remove either the radiation-exposed or the unexposed areas of the photoresist (depending upon whether a positive photoresist or a negative photoresist is utilized) resulting in a patterned or developed photoresist.

The mask is a critical element in lithography. Defects in the mask lead to imprecise exposure and consequent decreases in resolution, precise pattern formation and/or the quality of subsequent processing steps. For example, a contaminant particle on a mask may prevent radiation from contacting an area of a photoresist that should receive radiation, resulting in an incompletely exposed photoresist, which would lead to an undesirable pattern formation in the subsequently developed photoresist. Mal-formed structures inhibit the proper function of semiconductor devices.

Contaminant particles that adhere to a mask surface and are capable of at least partially blocking light that should pass through the mask constitute mask defects. Moreover, airborne contaminant particles that are capable of at least partially blocking light that should pass through the mask constitute defects as well. The concern or potential damage attributable to contaminant particles increases as the wavelength of light used to selectively expose photoresists decreases. That is, it is more likely for a contaminant particle to block light having a small wavelength compared to light having a large wavelength. This is especially true for small wavelengths below about 160 nm. Small wavelengths below about 160 nm involves next generation lithography (NGL). The concern over contaminant particles is great because one defect or particle on a mask may constitute a fatal defect requiring expensive and burdensome mask replacement. Moreover, as geometries shrink, small defects have an increasingly detrimental impact on NGL processing.

A pellicle is a transparent, thin membrane (often 99% or more light transmission) that seals off the mask surface from airborne particles and is not damaged by repeated illumination over time. Pellicles are therefore useful for preventing contaminant particles to cause defects in photolithography. However, at small wavelengths below about 160 nm, suitable pellicles with such properties (good light transmission, no damage due to illumination exposure over time) are unavailable.

When a photoresist clad semiconductor substrate is charged into a processing chamber, such as a reticle chamber, it is desirable for the lithography mask to be free of contaminant particles. However, it is difficult to remove contaminant particles from a mask, as it is often required to remove the contaminated mask from the processing chamber. It is also difficult to remove contaminant particles from a mask without damaging the mask or other hardware within the processing chamber. Since NGL masks are expensive, since suitable NGL pellicles are unavailable, and since NGL masks are particularly difficult to repair, it is highly desirable to avoid any damage to NGL masks.

SUMMARY OF THE INVENTION

The present invention provides an improved lithography process wherein ionization is employed to reduce mask defects. The present invention particularly provides methods for reducing mask defects using an inert plasma, wherein the ionized ions remove mask defects. The methods of the present invention also provide for the removal of airborne particles from processing chambers, thereby preventing contamination of lithography masks, and particularly NGL masks. As a result of the present invention, a subsequently patterned resist of increased quality (fewer pattern defects, improved resolution, improved critical dimension control, etc.) comparable to a patterned resist where the present invention is not employed is obtainable.

In one embodiment, the present invention relates to a method of processing a semiconductor structure including a resist thereon, involving contacting the semiconductor structure including the resist with a plasma comprising at least one inert gas selected from the group consisting of nitrogen, helium, neon, argon, krypton and xenon; exposing the semiconductor structure including the resist to actinic radiation having a wavelength of about 160 nm or less through a lithography mask; and developing the resist with a developer.

In another embodiment, the present invention relates to a method of reducing defects on a lithography mask, involving the steps of providing a semiconductor structure and the lithography mask in a processing chamber, the lithography mask having defects thereon; charging the processing chamber with a plasma comprising at least one inert gas selected from the group consisting of nitrogen, helium, neon, argon, krypton and xenon to provide the lithography mask having a reduced number of defects thereon; and exposing the semiconductor structure in the processing chamber to actinic radiation having a wavelength of about 160 nm or less through the lithography mask.

In yet another embodiment, the present invention relates to a method of processing a lithography mask and a semiconductor structure containing a photoresist, involving the steps of contacting the lithography mask and the semiconductor structure including the photoresist with a plasma comprising at least one inert gas selected from the group consisting of nitrogen, helium, neon, argon, krypton and xenon under a pressure from about 0.0001 Torr to about 0.1 Torr; exposing the semiconductor structure including the photoresist to actinic radiation having a wavelength of about 160 nm or less through the lithography mask; and developing the photoresist with an aqueous alkaline developer.

DISCLOSURE OF INVENTION

Figure 1:
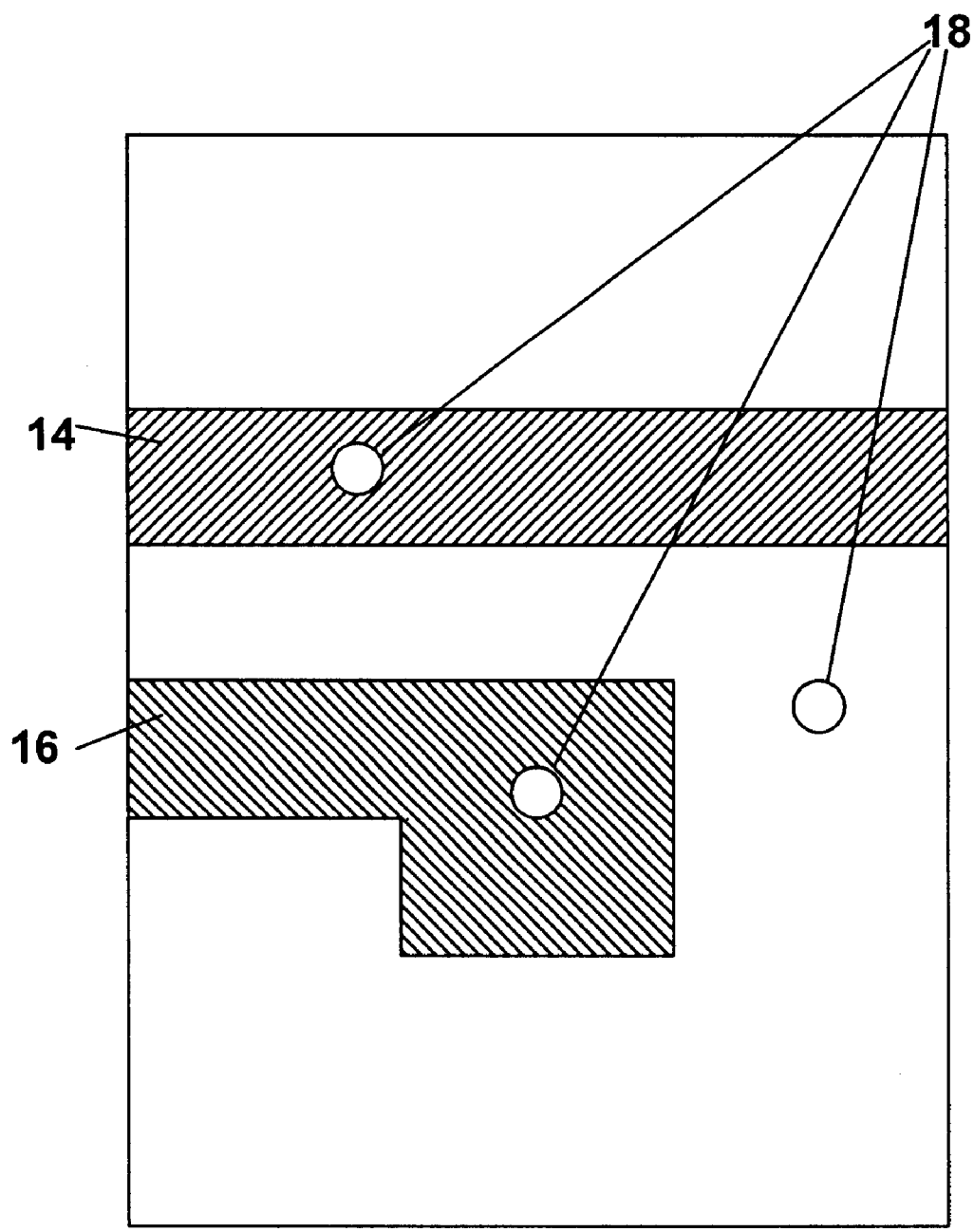
FIG. 1 is a top-down view of a lithography mask having defects according to one embodiment of the present invention.

The present invention involves improving lithography by employing an ionized plasma to remove defects from a mask. The present invention more specifically involves contacting an ionized inert gas with a lithography mask (and optionally one or more lens) in a processing chamber before the resist coated substrate is selectively exposed with actinic radiation.

During lithography, a suitable resist, such as an organic photoresist, is provided over a semiconductor substrate. The semiconductor substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The resist is provided over at least a portion of the substrate, but typically over the entire substrate.

Suitable resists include those sensitive to relatively short wavelength radiation and may be applied to the substrate surface by any suitable means including spin-on techniques. Short wavelength radiation includes light having a wavelength less than about 160 nm and short wavelength radiation sensitive resists include resists sensitive to about 160 nm or less light. In another embodiment, short wavelength radiation sensitive resists include resists sensitive to about 100 nm or less light. In yet another embodiment, short wavelength radiation sensitive resists include resists sensitive to about 20 nm or less light (such as about 13 nm and about 11 nm. In still yet another embodiment, short wavelength radiation sensitive resists include resists sensitive to E-beams.

For example, a 157 nm photoresist or an extreme ultraviolet (EUV) photoresist may be applied to the substrate surface. In one embodiment, a chemically amplified photoresist material is applied to the substrate surface. Positive or negative photoresists may be used, but positive photoresists are preferred. Photoresists are commercially available from a number of sources, including Shipley Company, Kodak, Hoechst Celanese Corporation, Clariant, Hunt, Arch Chemical, Aquamer, JSR Microelectronics, and Brewer. The resist is typically applied to any suitable thickness, typically from about 200 Å to about 10,000 Å, although the thickness of the resist is not critical to the invention.

Optionally after the resist is applied to the substrate surface, the resist covered substrate is subjected to a soft bake to drive off excess solvent and/or to increase adhesion with the substrate surface. The soft bake involves heating at an elevated temperature for a suitable period of time.

The resist covered substrate is next transferred to a processing chamber for selective exposure. For example, the processing chamber may be a reticle chamber, an exposure chamber, or an ionization/vacuum chamber, or any combination thereof. A mask is employed to selectively expose the resist. Prior to selective irradiation, a plasma is charged into the chamber containing the resist covered substrate, the mask, and related equipment (such as a light source, lenses, etc.) wherein ionization takes place. The plasma, comprised of an ionized gas, functions to remove contaminants from the mask, reticle, lens and/or air space. The contaminants constitute defects that may lead to incomplete or over exposure of the resist during selective irradiation. The contaminants may be negatively charged, neutrally charged, and/or positively charged.

The plasma gas flow contains at least one inert gas, such as nitrogen and the noble gases. Examples of noble gases include He, Ne, Ar, Kr and Xe. A suitable amount of plasma is charged into the chamber to remove substantially all contaminants and preferably all contaminants. In one embodiment, the gas flow contains from about 10 sccm to about 10 slm of at least one inert gas. In another embodiment, the gas flow contains from about 25 sccm to about 5 slm of at least one inert gas. In yet another embodiment, the gas flow contains from about 50 sccm to about 1 slm of at least one inert gas. In a preferred embodiment, the gas flow does not contain an active or reactive gas.

The plasma gas flow contains at least one of a positively charged ionic species and a negatively charged ionic species. While not wishing to be bound by any theory, it is believed that the plasma lifts contaminants off of the mask, reticle, and/or lens so that they may be removed from the chamber. Again, while not wishing to be bound by any theory, it is believed that the positively charged plasma species lifts negatively charged contaminants off of the mask, reticle, and/or lens while the negatively charged plasma species lifts positively charged contaminants off of the mask, reticle, and/or lens.

A suitably weak vacuum may be employed to remove the floating particles including the contaminants from the air space of the processing chamber. In one embodiment, the pressure in the processing chamber is from about 0.0001 Torr to about 0.1 Torr. In another embodiment, the pressure in the processing chamber is from about 0.001 Torr to about 0.01 Torr.

The temperature during ionization is effective for promoting the reduction of defects on the mask, reticle, and/or lens, without causing any damage or degradation to the mask, reticle, and/or lens. In one embodiment, the temperature in the processing chamber is from about 20° C. to about 50° C. In another embodiment, the temperature in the processing chamber is about room temperature.

In one embodiment, the ionization step serves to remove contaminant particles from the lithography mask, reticle, and/or lens in a processing chamber. In another embodiment, the ionization step serves to remove airborne contaminant particles from the processing chamber.

Since the ionization is effective for reducing defects on the mask, reticle, and/or lens, one advantage associated with the present invention is that it is not necessary to remove the mask from the processing chamber in order to inspect the mask prior to selective exposure. Another advantage associated with the present invention is that the defect reduction chamber and the exposure chamber may be integrated; that is, defect reduction and exposure may take place in the same processing chamber. Yet another advantage associated with the present invention is that a pellicle is not required or necessary to successfully carry out photolithography (not required for an NGL mask).

After defects are reduced, minimized and/or eliminated in accordance with the present invention, the resist covered substrate is selectively exposed to actinic radiation of relatively short wavelength light to cause a chemical transformation in desired regions of the resist. The wavelength of radiation depends primarily upon the identity of the resist material. Short wavelength radiation having a wavelength less than about 160 nm is employed, such as 157 nm light. In another embodiment, radiation having a wavelength less than about 20 nm is employed, such as 13 nm and 11 nm light (or an E-beam).

In embodiments where the resist covered substrate is selectively exposed to actinic radiation more than once, for instance in a stepper, ionization may be conducted just prior to each exposure to actinic radiation. Thus, the present invention may involve repeatedly ionizing and selectively exposing a resist covered substrate.

The selectively exposed resist is next developed using a suitable aqueous developer. The specific identity of the developer is not critical to the invention, but typically an aqueous alkaline solution is employed. For example, aqueous tetramethylammonium hydroxide is frequently employed as a developer solution.

During development, either the exposed portion of the resist (e.g., positive photoresist) or the unexposed portion of the resist (e.g., negative photoresist) is soluble or is solubilized in the developing solution. The portion of the resist that is not substantially soluble in the developing solution remains on the substrate. Development results in a patterned resist over the substrate surface.

After optionally rinsing the substrate, a patterned resist covered substrate having an accurate pattern, high resolution and good critical dimension control is obtained. As a result, subsequent processing of the substrate is facilitated and the quality of devices made is improved by the methods of the present invention.

Figure 2:
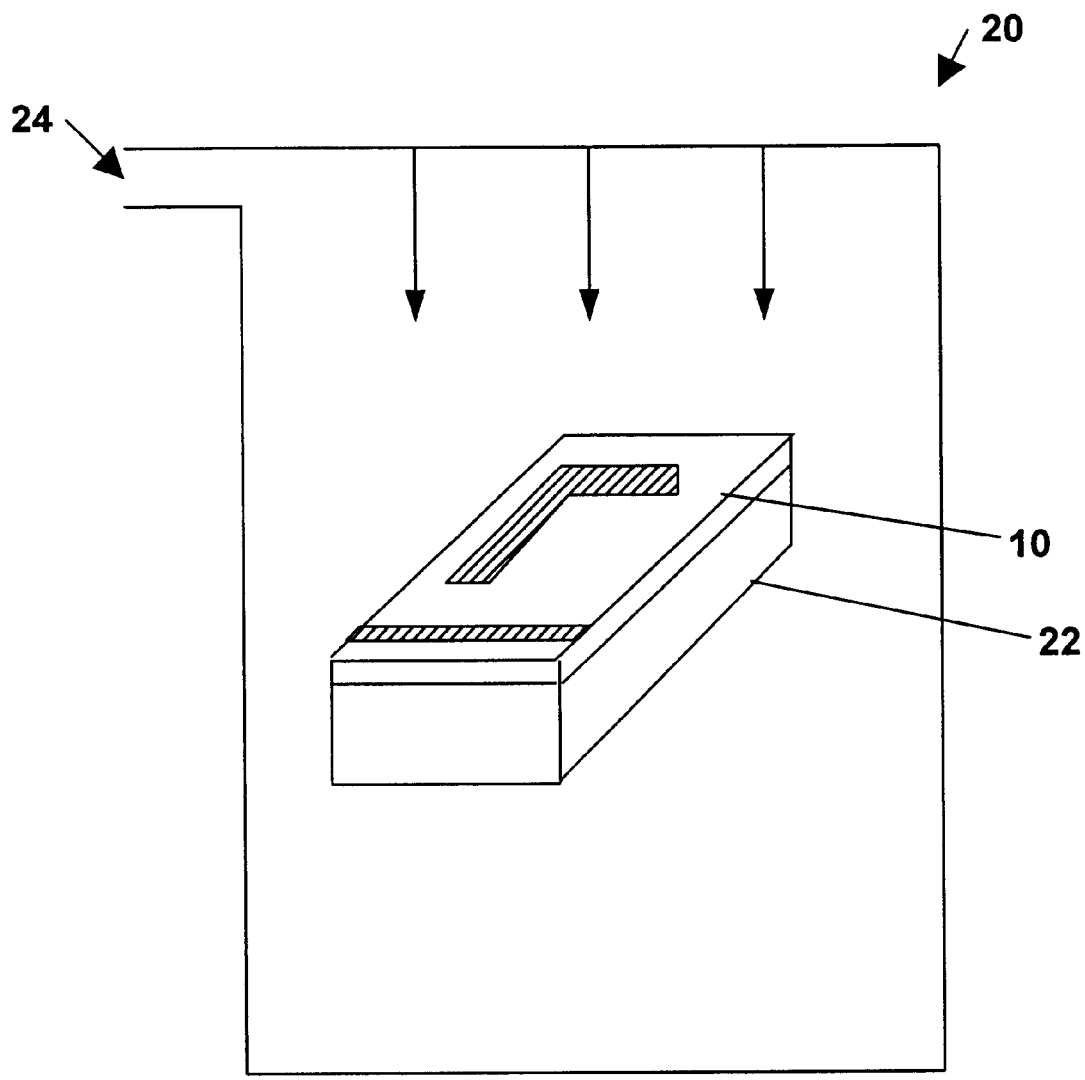
FIG. 2 is a frontal view of a processing chamber housing a lithography mask on a semiconductor substrate according to one embodiment of the present invention.
Figure 3:
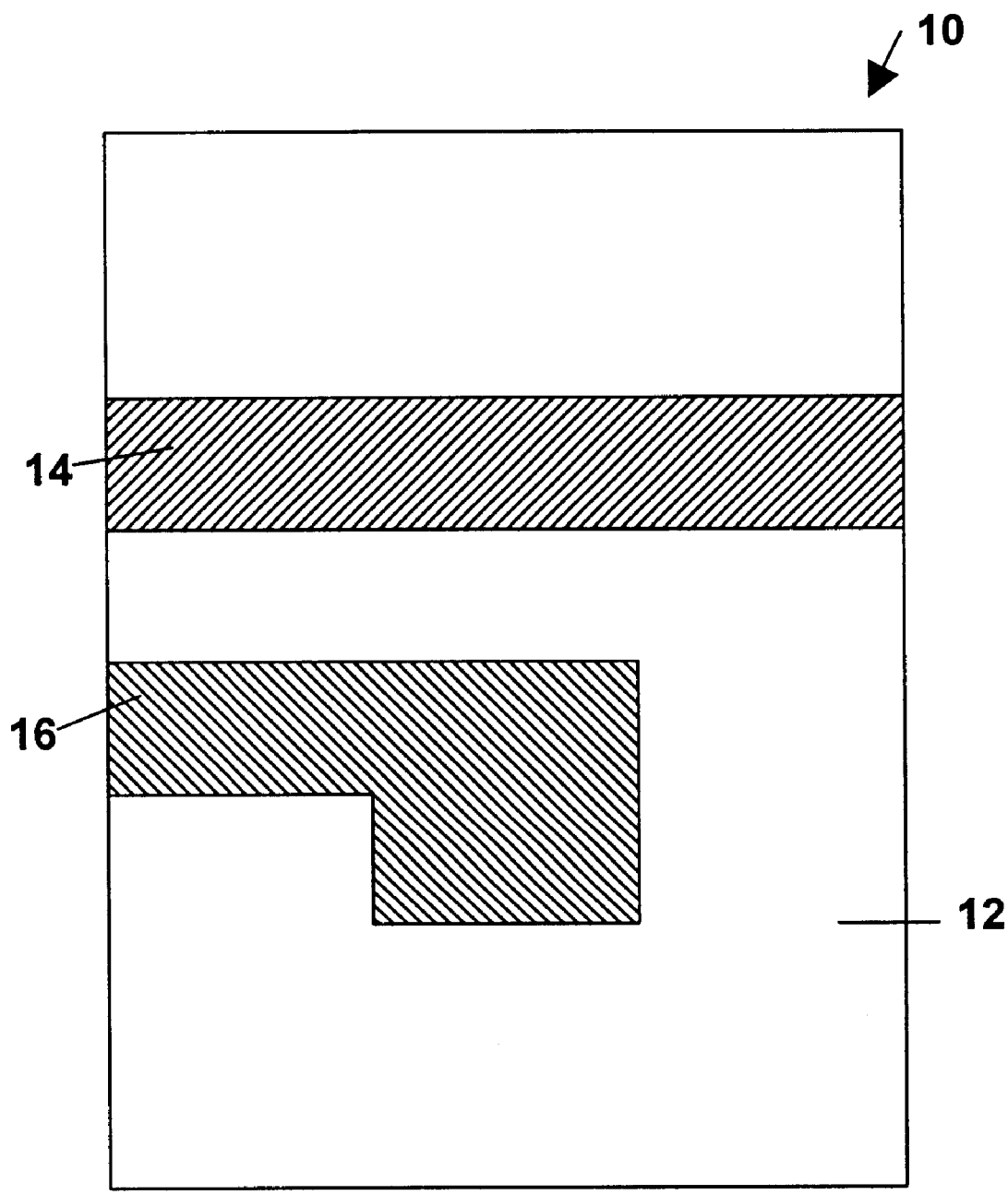
FIG. 3 is a top-down view of a lithography mask free of defects according to one embodiment of the present invention.

Referring generally to FIGS. 1 to 3, one exemplary embodiment of the present invention is described. Specifically referring to FIG. 1, a lithography mask 10, such as an NGL mask, is shown having opaque regions 12, phase shift regions 14, and clear regions 16. The lithography mask 10 has a number of defects 18, such as contaminating particles. Defects 18 in the phase shift regions 14 and clear regions 16 may lead to mal-formed structures in the patterned resist (not shown), which in turn, can undesirably lead to mal-formed structures in the underlying resist covered semiconductor substrate (not shown).

Referring to FIG. 2, the lithography mask 10 overlying the resist covered semiconductor substrate 22 is placed into a processing chamber 20. In this embodiment, the processing chamber 20 is an ionization and exposure chamber. The processing chamber 20 is equipped with an exhaust 24 into order to form a relatively weak vacuum. A plasma (represented by the arrows) containing ionized argon and nitrogen is then contacted with the lithography mask 10 overlying the resist covered semiconductor substrate 22 under a pressure of about 0.015 Torr at room temperature. Next, the lithography mask 10 overlying the resist covered semiconductor substrate 22 is subjected to irradiation by light having a wavelength of about 157 nm in order to selectively expose the resist. The exposed, resist covered semiconductor substrate 22 can then be subjected to further lithographic and semiconductor processing, including resist pattern development, etching/deposition, and resist stripping steps.

Referring to FIG. 3, the lithography mask 10 free of defects is shown after ionization. Defects in the lithography mask 10 are eliminated as a result of the ionization. Since the phase shift regions 14 and clear regions 16 do not contain any defects, light will freely pass therethrough without any blockage by contaminants. Moreover, contaminants in the open space of the processing chamber 20 are also eliminated by ionization. Contaminants may be removed from the processing chamber 20 via exhaust 24. Accurate resist pattens may then be formed in the resist covered semiconductor substrate 22.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a semiconductor structure including a resist thereon, comprising:
    contacting the semiconductor structure including the resist with a plasma comprising at least one inert gas selected from the group consisting of nitrogen, helium, neon, argon, krypton and xenon;
    exposing the semiconductor structure including the resist to actinic radiation having a wavelength of about 160 nm or less through a lithography mask; and
    developing the resist with a developer.

2. The method of claim 1, wherein the plasma comprises nitrogen.

3. The method of claim 1, wherein the plasma comprises argon.

4. The method of claim 1, wherein the plasma comprises a noble gas.

5. The method of claim 1, wherein the semiconductor structure is contacted with the plasma under a pressure from about 0.001 Torr to about 0.01 Torr.

6. The method of claim 1, wherein the semiconductor structure is contacted with the plasma under a temperature from about 20° C. to about 50° C.

7. The method of claim 1, wherein the actinic radiation has a wavelength of about 20 nm or less.

8. The method of claim 1, wherein the contacting step and the exposing step are repeated at least one time.

9. A method of reducing defects on a lithography mask, comprising:

provinding a semiconductor structure and the lithography mask in a processing chamber, the lithography mask having defects thereon;

charging the processing chamber with a plasma comprising at least one inert gas selected from the group consisting of nitrogen, helium, neon, argon, krypton and xenon to provide the lithography mask having a reduced number of defects thereon; and exposing the semiconductor structure in the processing chamber to actinic radiation having a wavelength of about 160 nm or less through the lithography mask.

10. The method of claim 9, wherein the processing chamber is a reticle chamber.

11. The method of claim 9, wherein the lithography mask is not removed from the processing chamber during and between charging the processing chamber with a plasma and exposing the semiconductor structure to actinic radiation.

12. The method of claim 9, wherein the plasma comprises from about 10 sccm to about 10 slm of nitrogen.

13. The method of claim 9, wherein the plasma comprises from about 10 sccm to about 10 slm of argon.

14. The method of claim 9, wherein the plasma comprises a noble gas.

15. The method of claim 9, wherein the actinic radiation has a wavelength of about 100 nm or less.

16. The method of claim 9, wherein the actinic radiation has a wavelength of at least one of about 11 nm, 13 nm, and 157 nm.

17. A method of processing a lithography mask and a semiconductor structure containing a photoresist, comprising:

contacting the lithography mask and the semiconductor structure including the photoresist with a plasma comprising at least one inert gas selected from the group consisting of nitrogen, helium, neon, argon, krypton and xenon under a pressure from about 0.0001 Torr to about 0.1 Torr;

exposing the semiconductor structure including the photoresist to actinic radiation having a wavelength of about 160 nm or less through the lithography mask; and developing the photoresist with an aqueous alkaline developer.

18. The method of claim 17, wherein the plasma comprises at least one of nitrogen and argon.

19. The method of claim 17, wherein the semiconductor structure is contacted with the plasma under a temperature from about 20° C. to about 50° C.

20. The method of claim 17, wherein the photoresist is one of an EUV photoresist and a 157 nm photoresist.

* * * * *